(12) United States Patent
Keng et al.

(10) Patent No.: US 11,637,109 B2
(45) Date of Patent: Apr. 25, 2023

(54) SOURCE/DRAIN FEATURE SEPARATION STRUCTURE

(71) Applicant: Taiwan Semiconductor Manufacturing Co., Ltd., Hsin-Chu (TW)

(72) Inventors: Wen-Chun Keng, Hsinchu County (TW); Kuo-Hsiu Hsu, Taoyuan County (TW); Chih-Chuan Yang, Hsinchu (TW); Lien Jung Hung, Taipei (TW); Ping-Wei Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/915,609

(22) Filed: Jun. 29, 2020

(65) Prior Publication Data
US 2021/0408012 A1 Dec. 30, 2021

(51) Int. Cl.
*H01L 27/092* (2006.01)
*H01L 21/768* (2006.01)
(Continued)

(52) U.S. Cl.
CPC .... *H01L 27/1108* (2013.01); *H01L 21/02126* (2013.01); *H01L 21/02167* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02532* (2013.01); *H01L 21/02603* (2013.01); *H01L 21/764* (2013.01); *H01L 21/823807* (2013.01); *H01L 21/823814* (2013.01); *H01L 21/823878* (2013.01); *H01L 27/092* (2013.01); *H01L 29/0653* (2013.01);
(Continued)

(58) Field of Classification Search
CPC ....... H01L 21/31053; H01L 21/823431; H01L 21/823481; H01L 27/0886; H01L 21/762
See application file for complete search history.

(56) References Cited

U.S. PATENT DOCUMENTS

| 9,818,872 B2 | 11/2017 | Ching et al. |
| 9,887,269 B2 | 2/2018 | Ching et al. |

(Continued)

OTHER PUBLICATIONS

U.S. Appl. No. 15/887,347, filed Jun. 21, 2018, Ching et al.

*Primary Examiner* — Brian Turner
(74) *Attorney, Agent, or Firm* — Haynes and Boone, LLP

(57) ABSTRACT

A semiconductor device according to the present disclosure includes a first source/drain feature, a second source/drain feature, a third source/drain feature, a first dummy fin disposed between the first source/drain feature and the second source/drain feature along a direction to isolate the first source/drain feature from the second source/drain feature, and a second dummy fin disposed between the second source/drain feature and the third source/drain feature along the direction to isolate the second source/drain feature from the third source/drain feature. The first dummy fin includes an outer dielectric layer, an inner dielectric layer over the outer dielectric layer, and a first capping layer disposed over the outer dielectric layer and the inner dielectric layer. The second dummy fin includes a base portion and a second capping layer disposed over the base portion.

20 Claims, 13 Drawing Sheets

(51) Int. Cl.
H01L 27/088 (2006.01)
H01L 29/423 (2006.01)
H01L 29/66 (2006.01)
H01L 21/8234 (2006.01)
H01L 27/11 (2006.01)
H01L 21/02 (2006.01)
H01L 21/8238 (2006.01)
H01L 29/06 (2006.01)
H01L 29/786 (2006.01)
H01L 21/764 (2006.01)

(52) U.S. Cl.
CPC .... H01L 29/0673 (2013.01); H01L 29/42392 (2013.01); H01L 29/66545 (2013.01); H01L 29/66742 (2013.01); H01L 29/78618 (2013.01); H01L 29/78696 (2013.01)

(56) References Cited

U.S. PATENT DOCUMENTS

| | | |
|---|---|---|
| 9,899,398 B1 | 2/2018 | Colinge et al. |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,475,902 B2 | 11/2019 | Lee et al. |
| 2013/0154027 A1* | 6/2013 | Liaw .............. H01L 27/1104 257/E27.06 |
| 2014/0145250 A1* | 5/2014 | Cheng ............ H01L 29/7851 257/289 |
| 2016/0126143 A1* | 5/2016 | Su ................. H01L 29/42392 438/296 |
| 2017/0110182 A1* | 4/2017 | Liaw ............... G11C 11/417 |
| 2018/0315608 A1* | 11/2018 | Tang ............. H01L 21/02337 |
| 2019/0006371 A1* | 1/2019 | Ohtou ........... H01L 21/823431 |
| 2019/0103304 A1* | 4/2019 | Lin ................. H01L 29/6681 |
| 2019/0287972 A1* | 9/2019 | Hafez ........... H01L 21/823431 |

* cited by examiner

SOURCE/DRAIN FEATURE SEPARATION STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

IC devices may include repeating physical design blocks that are referred to as standard cells. Such standard cells may include logic gates, such as NAND, NOR, XNOR, XOR, AND, OR, INVERTER standard cells, or memory bits, such as SRAM cells. One way to achieve smaller geometric sizes is to reduce the dimensions of a standard cell. Because standard cells are repeated multiple times, a dimensional reduction in a standard cell may translate into substantial reduction in size. A standard cell may include multiple active regions (such as multiple fin structures or multiple stacks of bridge-like channel members) that are interleaved by multiple dummy fins that function to isolate source/drain features of neighboring devices. Dummy fins take up space and may pose challenges when dimensions of standard cells shrink. Therefore, while conventional dummy fins and methods of forming the same may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
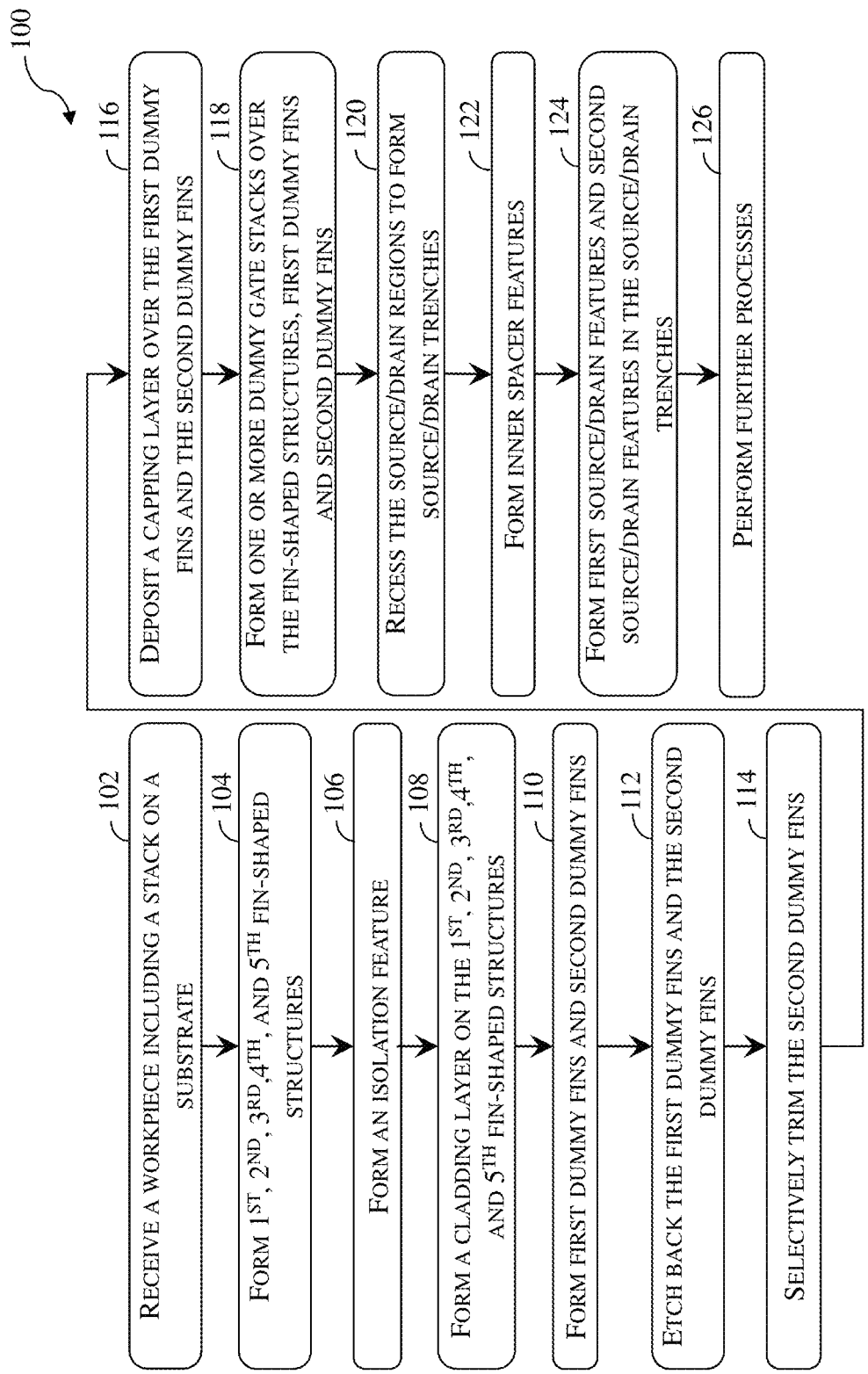
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to source/drain separation structures and fabrication methods, and more particularly to forming different dummy fins to achieve different spacings between active regions for either dimensional reduction or performance improvement.

As described above, MBC transistors may also be referred to as SGTs, GAA transistors, nanosheet transistors, or nanowire transistors. They can be either n-type or p-type. A standard cell may include multiple MBC transistors that are formed from fin-shaped structures. Each of these fin-shaped structures includes a plurality of channel layers interleaved by a plurality of sacrificial layers. In some conventional technologies, the fin-shaped structures are parallel to one another and are equally spaced and dummy fins are inserted between fin-shaped structures. The dummy fins function to separate source/drain features of neighboring devices. When fin-shaped structures are not equally spaced, widths of the dummy fins may vary and etch loading may result into uneven heights and structures of dummy fins, when may lead to merging of source/drain features and device failures.

The present disclosure provides a process for forming different dummy fins of varying widths and structures. Such different dummy fins may include a first dummy fin and a second dummy fin that is narrower than the first dummy fin. Due to the width difference, the first dummy fin and the second dummy fin have different structures that may etch differently in an etch back process. The present disclosure provides a process to ensure even heights of the first dummy fin and the second dummy fin to satisfactorily separate neighboring source/drain features. The process and structure of the present disclosure enables reduction of standard cell sizes or improvement of performance of a standard cell.

The various aspects of the present disclosure will now be described in more detail with reference to the figures. FIG. 1 illustrates a flowchart of a method 100 of forming a semiconductor device from a workpiece according to one or more aspects of the present disclosure. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2-12, which illustrate fragmentary cross-sectional views of the workpiece at different stages of fabrication according to embodiments of method 100.

Figure 2:
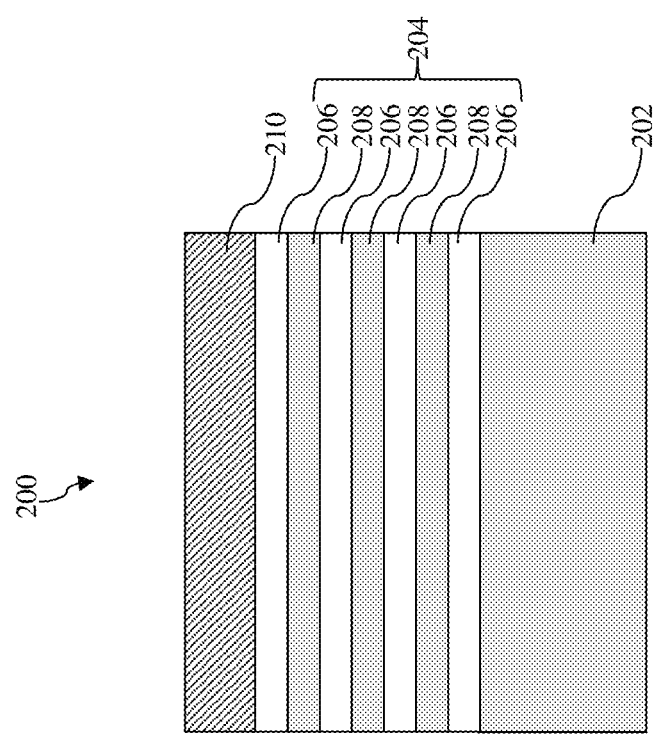
FIGS. 2-12 illustrate fragmentary cross-sectional views of a workpiece during a fabrication process according to the method of FIG. 1, according to one or more aspects of the present disclosure.

Referring to FIGS. 1 and 2, method 100 includes a block 102 where a workpiece 200 is received. Because a semiconductor device will be formed from the workpiece 200, the workpiece 200 may be referred to as a semiconductor device 200 as the context requires. As shown in FIG. 2, the workpiece 200 includes a substrate 202 and a stack 204 disposed on the substrate 202. In one embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion.

Referring still to FIG. 2, the stack 104 may include a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. The stack 204 may be epitaxially deposited using CVD deposition techniques (e.g., vapor-phase epitaxy (VPE) and/or ultra-high vacuum CVD (UHV-CVD)), molecular beam epitaxy (MBE), and/or other suitable processes. The sacrificial layers 206 and the channel layers 208 are deposited alternatingly, one-after-another, to form the stack 204. It is noted that four (4) layers of the sacrificial layers 206 and three (3) layers of the channel layers 208 are alternately and vertically arranged as illustrated in FIG. 2, which are for illustrative purposes only and not intended to be limiting beyond what is specifically recited in the claims. The number of layers depends on the desired number of channels members for the semiconductor device 200. In some embodiments, the number of the channel layers 208 is between 2 and 10. For patterning purposes, the workpiece 200 may also include a hard mask layer 210 over the stack 204. The hard mask layer 210 may be a single layer or a multilayer. In one example, the hard mask layer 210 includes a silicon oxide layer and a silicon nitride layer.

Figure 3:
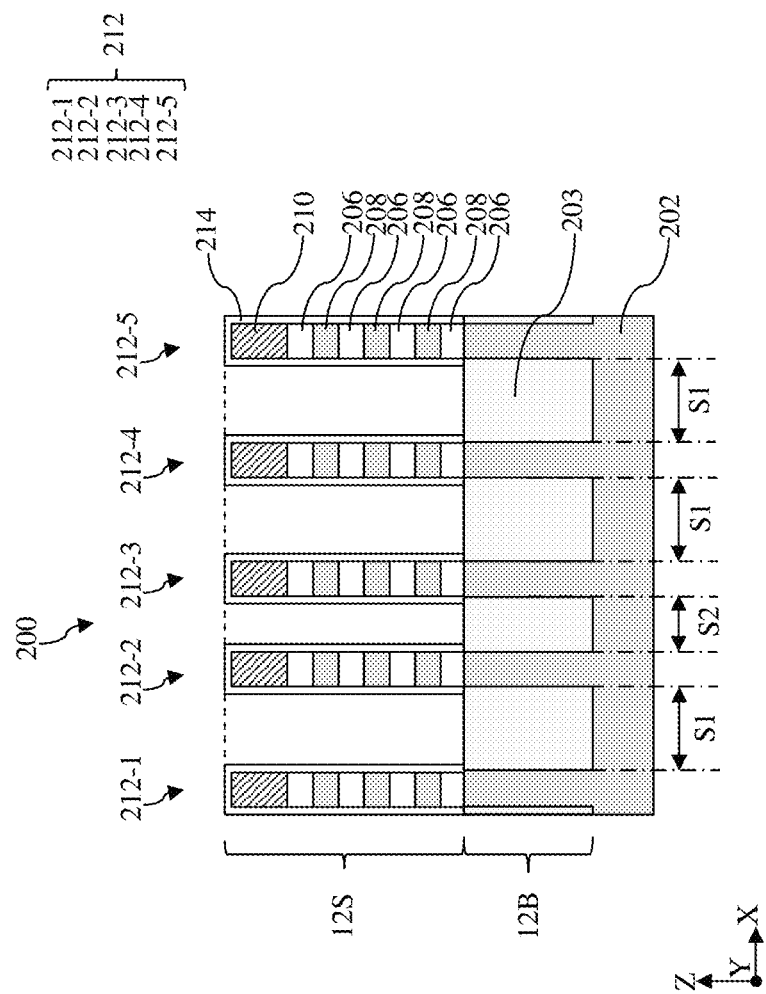

Referring to FIGS. 1 and 3, method 100 includes a block 104 where a first fin-shaped structure 212-1, a second fin-shaped structure 212-2, a third fin-shaped structure 212-3, a fourth fin-shaped structure 212-4, and a fifth fin-shaped structure 212-5 are formed. For ease of reference, the first fin-shaped structure 212-1, the second fin-shaped structure 212-2, the third fin-shaped structure 212-3, the fourth fin-shaped structure 212-4, and the fifth fin-shaped structure 212-5 may be collectively referred to as fin-shaped structures 212. As shown in FIG. 3, the fin-shaped structure 212 are formed from the stack 204 and a portion of the substrate 202. In some embodiments, at block 104, the stack 204 and the substrate 202 are patterned to form the fin-shaped structures 212. The fin-shaped structures 212 extend vertically along the Z direction from the substrate 202. Each of the fin-shaped structures 212 includes a base portion 12B formed from the substrate 202 and a stack portion 12S formed from the stack 204. The fin-shaped structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structures 212 by etching the stack 204 and the substrate 202. The etching process can include dry etching, wet etching, reactive ion etching (RIE), and/or other suitable processes.

In some embodiments presented in FIG. 3, the fin-shaped structures 212 are differently spaced. The first fin-shaped structure 212-1 is spaced apart from the second fin-shaped structure 212-2 by a first spacing S1. The second fin-shaped structure 212-2 is spaced apart from the third fin-shaped structure 212-3 by a second spacing S2. The third fin-shaped structure 212-3 is spaced apart from the fourth fin-shaped structure 212-4 by the first spacing S1. The fourth fin-shaped structure 212-4 is spaced apart from the fifth fin-shaped structure 212-5 by the first spacing S1. In the illustrated example, the second spacing S2 is smaller than the first spacing S1. According to the present disclosure, the smaller second spacing S2 may be implemented for at least two reasons. In the context of standard cells, the smaller second spacing S2 may reduce a width of a standard cell as compared to another standard cell that includes uniform first spacings S1. When a width of a standard cell is fixed, the smaller second spacing S2 may translate into larger first spacings S1 or wider fin-shaped structures 212 for improvement of device performance. In some instances, the first spacing S1 may be between about 15 nm and about 40 nm and the second spacing S2 may be between about 5 nm and about 40 nm.

Referring to FIGS. 1 and 3, method 100 includes a block 106 where an isolation feature 203 is formed. After the fin-shaped structures 212 are formed, the isolation feature 203 is formed between neighboring fin-shaped structures 212. The isolation feature 203 may also be referred to as a shallow trench isolation (STI) feature 203. In an example process, a dielectric layer is first deposited over the workpiece 200, filling the trenches between fin-shaped structures 212 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, spin-on coating, and/or other suitable process. The deposited dielectric material is then thinned and planarized, for example by a chemical mechanical polishing (CMP) process. The planarized dielectric layer is further recessed by a dry etching process, a wet etching process, and/or a combination thereof to form the isolation feature 203. As shown in FIG. 3, the stack portions 12S of the fin-shaped structures 212 rise above the isolation feature 203.

Referring to FIGS. 1 and 3, method 100 includes a block 108 where a cladding layer 214 is formed over the first fin-shaped structure 212-1, the second fin-shaped structure 212-2, the third fin-shaped structure 212-3, the fourth fin-shaped structure 212-4, and the fifth fin-shaped structure 212-5. In some embodiments, the cladding layer 214 may have a composition similar to that of the sacrificial layers 206. In one example, the cladding layer 214 may be formed of silicon germanium (SiGe). The common composition allows selective removal of the sacrificial layers 206 and the cladding layer 214 during the release of channel layers 208 in a subsequent process. In some other embodiments, while both the sacrificial layers 206 and the cladding layer 214 are formed of silicon germanium (SiGe), the sacrificial layers 206 and the cladding layer 214 may have different germanium contents to introduce different etch selectivity during formation of inner spacer recesses. The cladding layer 214 may have a germanium content smaller than that of the sacrificial layers 206. In some instances, the sacrificial layer 206 may have a germanium content between about 20% and about 25% and the cladding layer 214 may have a germanium content between about 15% and about 19%. At block 108, the cladding layer 214 may be epitaxially grown using vapor phase epitaxy (VPE) or molecular bean epitaxy (MBE). In some implementations not explicitly shown in FIG. 3, the formation of the cladding layer 214 may be selective to the surfaces of the stack portions 12S of the fin-shaped structures 212 and little or no cladding layer 214 may be deposited over the hard mask layer 210 or the isolation feature 203. In some alternative implementations represented in FIG. 3, the formation of the cladding layer 214 may be conformal on the fin-shaped structures 212, including over the hard mask layer 210. In some embodiments, operations at block 108 may include etch back processes to remove cladding layer 214 on the isolation feature 203. An example etch back process may be a dry etch process that includes use of plasma of hydrogen bromide (HBr), oxygen ($O_2$), chlorine ($Cl_2$), or mixtures thereof.

Figure 4:
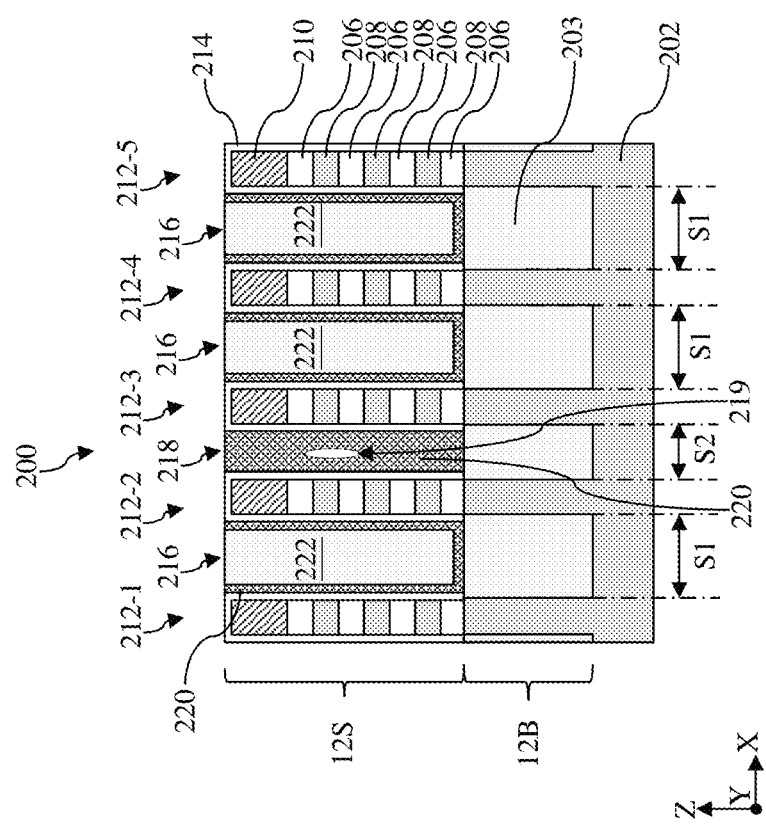

Referring to FIGS. 1 and 4, method 100 includes a block 110 where first dummy fins 216 and second dummy fins 218 are formed. As shown in FIG. 4, the first dummy fins 216 are dummy fins that fill the first spacings S1 between the first fin-shaped structure 212-1 and the second fin-shaped structure 212-2, between the third fin-shaped structure 212-3 and the fourth fin-shaped structure 212-4, and between the fourth fin-shaped structure 212-4 and the fifth fin-shaped structure 212-5. The second dummy fins 218 are dummy fins that fill the second spacings S2 between the second fin-shaped structure 212-2 and the third fin-shaped structure 212-3 and between other two similarly situated fin-shaped structures. In an example process, a first dielectric layer 220 is first conformally deposited over the workpiece 200, including along sidewalls of the fin-shaped structures 212 and the top surfaces of the isolation feature 203. In some embodiments, the first dielectric layer 220 may include silicon carbonitride (SiCN) or silicon oxycarbonitride (SiOCN) and may be deposited using CVD or atomic layer deposition (ALD). As shown in FIG. 4, the conformally deposited first dielectric layer 220 does not completely fill the first spacings S1 but may completely fill the second spacings S2. In some instances where the first dielectric layer 220 prematurely closes the opening between the second fin-shaped structure 212-2 and the third fin-shaped structure 212-3, a void 219 may be observed in the second dummy fin 218. After the deposition of the first dielectric layer 220, a second dielectric layer 222 is deposited over the workpiece 200, including over the first dielectric layer 220. In some embodiments, the second dielectric layer 222 may include silicon oxide and may be deposited using spin-on coating, a flowable CVD process or a suitable deposition process. In some instances, in order to improve integrity and density of the second dielectric layer 222, an anneal process may be performed to anneal the second dielectric layer 222. After the deposition of the second dielectric layer 222, a planarization process, such as an CMP process, may be performed to planarize the top surfaces of the first dielectric layer 220 and the second dielectric layer 222. After the planarization process, the first dummy fins 216 and the second dummy fins 218 are formed.

Reference is still made to FIG. 4. Because the first dummy fins 216 are formed in the first spacings S1, each of the first dummy fins 216 has a width comparable to the first spacing S1 along the X direction. In one embodiment, the width of the first dummy fin 216 is identical to the first spacing S1. Similarly, because the second dummy fins 218 are formed in the second spacings S2, each of the second dummy fins 218 has a width comparable to the second spacing S2 along the X direction. In one embodiment, the width of the second dummy fin 218 is identical to the second spacing S2. At this stage, the first dummy fin 216 may be regarded as having the first dielectric layer 220 as an outer dielectric layer 220 and the second dielectric layer 222 as an inner dielectric layer 222. As illustrated in FIG. 4, the outer dielectric layer 220 wraps around the sidewalls and bottom surface of the inner dielectric layer 222 and isolates the inner dielectric layer 222 from the cladding layer 214. The second dummy fin 218 includes the first dielectric layer 220 and is free of the second dielectric layer 222. Due to the different constructions, the first dummy fins 216 and the second dummy fins 218 may have different etch resistance and properties. The first dielectric layer 220, which may be formed of silicon carbonitride or silicon oxycarbonitride, is more etch resistant than the second dielectric layer 222, which may be formed of silicon oxide. Because the second dummy fins 218 are formed of the first dielectric layer 220 and free of the second dielectric layer 222, the second dummy fins 218 may etch at a slower rate than the first dummy fins 216 in an etch back process, such as the etch back process at block 112, as described below.

Figure 5:
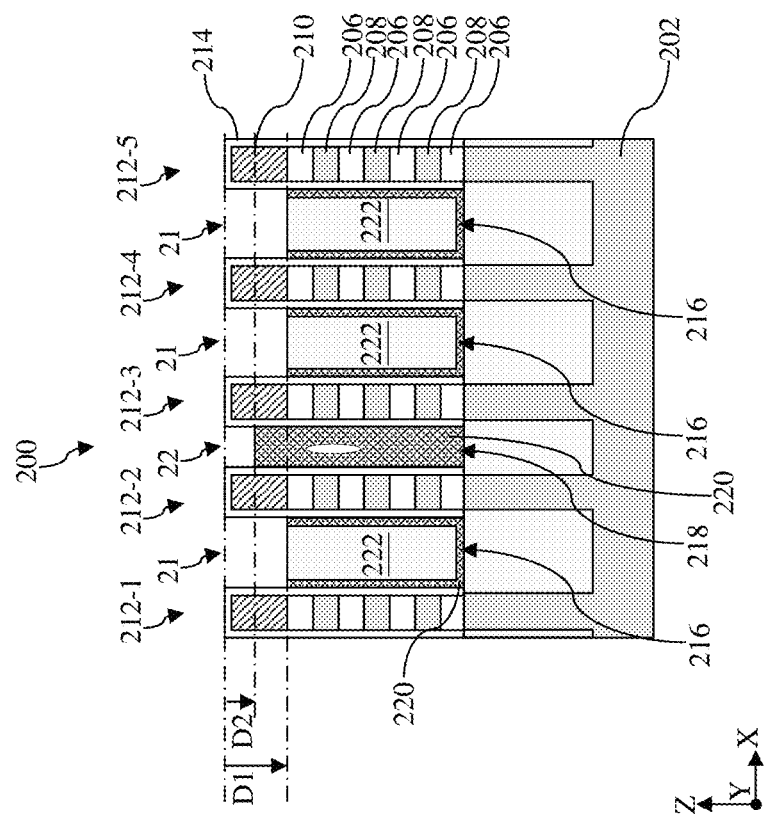

Referring to FIGS. 1 and 5, method 100 includes a block 112 where the first dummy fins 216 and the second dummy fins 218 are etched back. At block 112, the first dummy fins 216 and the second dummy fins 218 may be selectively and anisotropically etched back to form first recesses 21 and the second recesses 22. As shown in FIG. 5, due to the different constructions of the first dummy fins 216 and the second dummy fins 218, the first recesses 21 are deeper than the second recesses 22. In some implementations, the first recesses 21 may each have a first depth D1 along the Z direction and the second recesses 22 may each have a second depth D2 along the Z direction. The first depth D1 is greater than the second depth D2. The etch back at block 112 may be performed using a dry etch process. An example dry etch process may include use of an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 6:
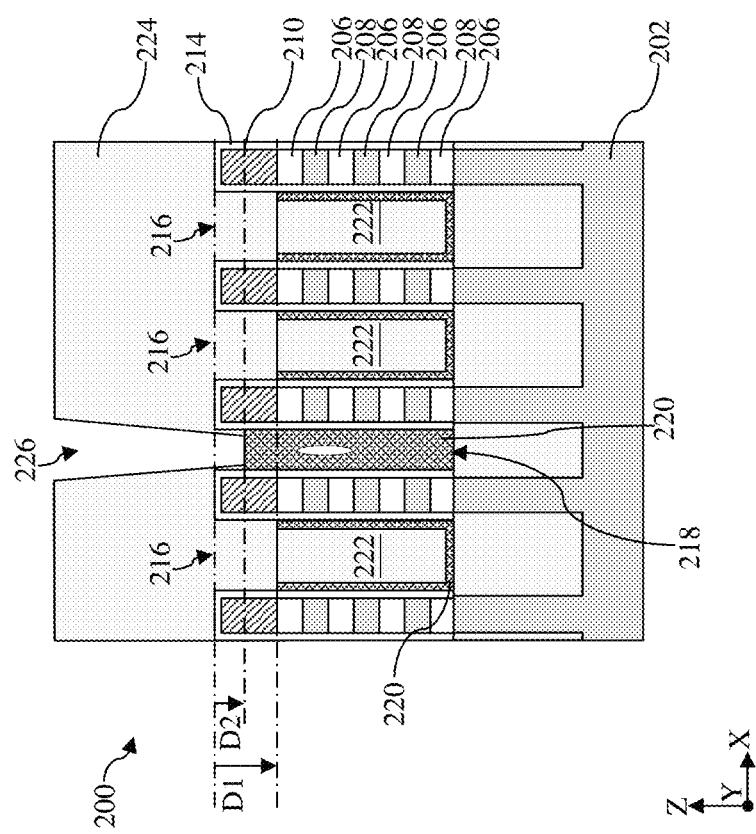
Figure 7:
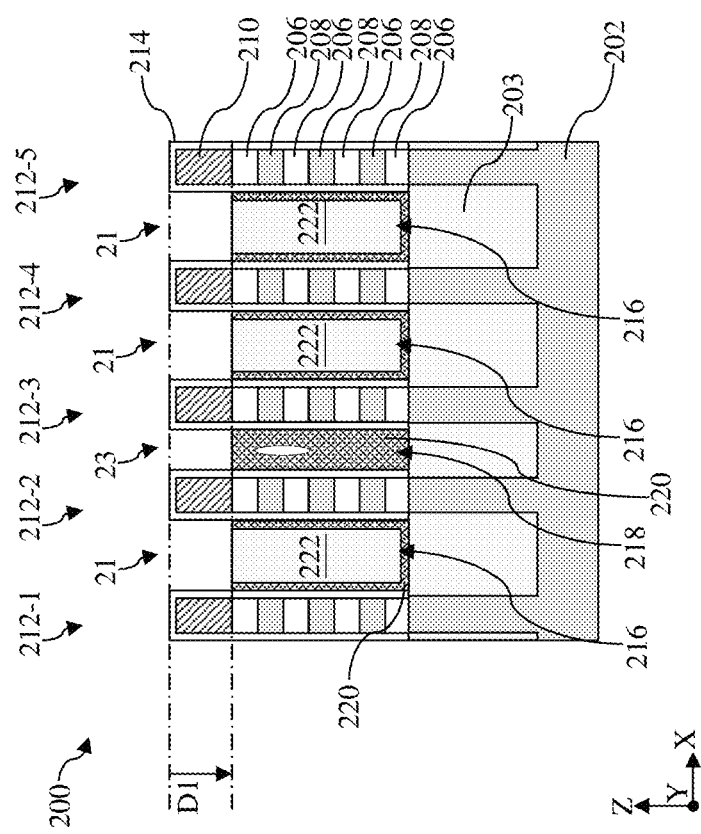

Referring to FIGS. 1, 6 and 7, method 100 includes a block 114 where the second dummy fins 218 are selectively trimmed. Because a capping layer 228 (to be described below) may be deposited in the recesses over the first dummy fins 216 and the second dummy fins 218, the smaller second depth D2 may result in a thinner capping layer 228 over the second dummy fins 218. Because the capping layer 228 functions as an etch-resistant protective layer, a smaller thickness thereof may cause undesirable removal of the capping layer 228 and excessive height reduction of the second dummy fins 218. With a smaller height, the second dummy fins 218 may not separate source/drain features of neighboring devices. To address this challenge, the present disclosure implements block 114 to selectively trim the second dummy fins 218 to increase the depth of the second recess 22 to form the deeper third recess 23 (shown in FIG. 7).

Reference is first made to FIG. 6. In an example process, the selective trimming at block 114 may include formation of a photoresist mask 224 that exposes the second dummy fins 218 and covers the rest of the workpiece 200. For example, a photoresist layer is first coated over the workpiece 200 using spin-on coating or a suitable process. To pattern the photoresist layer to form the photoresist mask 224, the photoresist layer is soft-baked, exposed to radiation transmitting through or reflected from a photomask, baked in a post-exposure bake process, developed in a developer solution, rinsed and dried. After the patterning, the photoresist mask 224 includes an opening 226 that exposes the second dummy fins 218. With the photoresist mask 224 in place, he second dummy fins 218 may be etched in a dry etch process, a wet etch process, or a suitable etch process. A suitable dry etch process may include use of use of an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. A suitable wet etch process may include use of diluted hydrofluoric (DHF) acid or buffered hydrofluoric (BHF) acid. In some embodiments illustrated in FIG. 7, the trimming operations at block 114 may increase the second depth D2 of the second recess 22 to form a third recess 23. In alternative embodiments, although the depth of the third recess 23 is greater than the second depth D2, it may be smaller or greater than the first depth D1. That is, the present disclosure does not require the third recess 23 to have a thickness identical to the first depth D1 as long as it is greater than the second depth D2. As shown in FIG. 7, after the selective trimming of the second dummy fins 218, the photoresist mask 224 may be removed by ashing or a suitable process.

Figure 8:
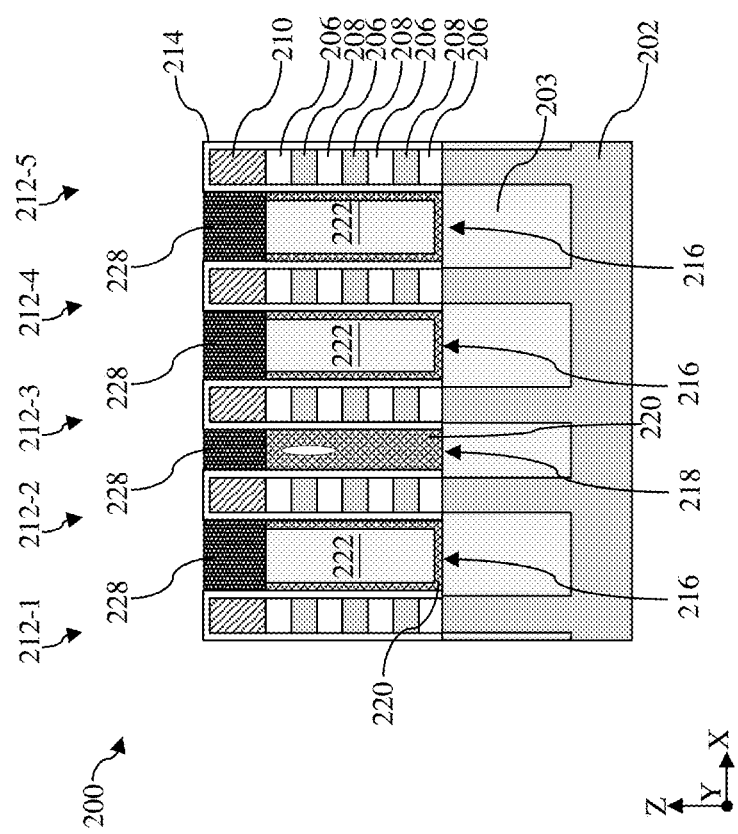

Referring to FIGS. 1 and 8, method 100 includes a block 116 where a capping layer 228 is deposited over the first dummy fins 216 and the second dummy fins 218. In some embodiments, the capping layer 228 may include a high-k dielectric material, such as a metal oxide. As used herein, a high-k dielectric material refers to a dielectric material that has a dielectric constant greater than that of silicon dioxide (~3.9). Suitable metal oxide may include hafnium oxide, zirconium oxide, titanium oxide, tantalum oxide, or aluminum oxide. In one embodiment, the capping layer 228 includes hafnium oxide. In some implementations, the capping layer 228 may be deposited using CVD, flowable CVD, or a suitable deposition method. The capping layer 228, as deposited, may cover top surfaces of the first dummy fins 216, the second dummy fins 218, the hard mask layer 210, and the cladding layer 214. The deposition of the capping layer 228 may be followed by a planarization process, such as a CMP process, to remove the capping layer 228 over the fin-shaped structures 212. At this point, the top surfaces of the first dummy fins 216 and the second dummy fins 218 are coplanar. After the planarization process, each of the first dummy fins 216 and the second dummy fins 218 is capped by the capping layer 228. The capping layer 228 may be regarded as a part of the first dummy fin 216 or the second dummy fin 218. In this regard, each of the second dummy fins 218 may be regarded as having a bottom portion formed of the first dielectric layer 220 and the capping layer 228 over the bottom portion. That is, after operations at block 116, each of the first dummy fins 216 includes the outer dielectric layer 220, the inner dielectric layer 222, and the capping layer 228; and each of the second dummy fins 218 includes the capping layer 228 disposed on the first dielectric layer 220. In some instances, the first dummy fins 216 may also be referred to as first hybrid fins 216 or first dielectric fins 216. Similarly, the second dummy fins 218 may also be referred to as second hybrid fins 218 or second dielectric fins 218. Because the first dummy fins 216 and the second dummy fins 218 only function as separation structures and are not formed of semiconductor materials, they do not form part of the functional circuit of the semiconductor device 200.

Figure 9:
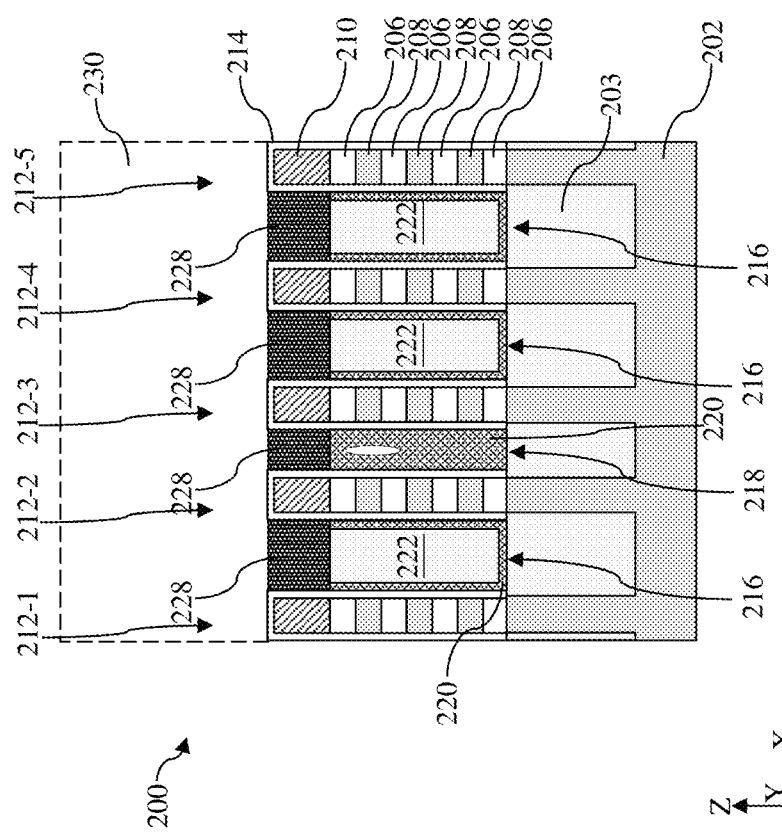

Referring to FIGS. 1 and 9, method 100 includes a block 118 where one or more dummy gate stacks 230 is formed over the fin-shaped structures 212, the first dummy fins 216, and the second dummy fins 218. In some embodiments, a gate replacement process (or gate-last process) is adopted where the one or more dummy gate stacks 230 serves as placeholders for functional gate structures. Other processes and configuration are possible. As the one-more dummy gate stacks 230 appears out of the planes of the cross-sectional view in FIG. 9, dotted lines are used to schematically show the relative position of the one or more dummy gate stacks 230. Although the one or more dummy gate stacks 230 are shown as a continuous structure that extends lengthwise along the X direction across the fin-shaped structures 212, they may include more than one dummy gate segment. The regions of the fin-shaped structures 212 underlying the one or more dummy gate stacks 230 may be referred to as channel regions. Each of the channel regions in a fin-shaped structure is sandwiched between two source/drain regions for source/drain formation.

Each of the one or more dummy gate stacks 230 may include a dummy dielectric layer and a dummy gate electrode. In some embodiments, the one or more dummy gate stacks 230 may be formed by various process steps such as layer deposition, patterning, etching, as well as other suitable processing steps. Exemplary layer deposition processes include low-pressure CVD, CVD, plasma-enhanced CVD (PECVD), PVD, ALD, thermal oxidation, e-beam evaporation, or other suitable deposition techniques, or combinations thereof. The patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In an example process, the dummy dielectric layer, the dummy electrode layer, and a gate-top hard mask layer are sequentially deposited over the workpiece 200, including over the fin-shaped structures 212. The dummy dielectric layer and the dummy electrode layer are then patterned using photolithography processes to form the one or more dummy gate stacks 230. In some embodiments, the dummy dielectric layer may include silicon oxide and the dummy electrode layer may include polycrystalline silicon (polysilicon). The gate-top hard mask layer may include a silicon oxide layer and a nitride layer.

Although not explicitly shown, after the formation of the one or more dummy gate stacks 230, one or more gate spacers may be deposited along sidewalls of the one or more dummy gate stacks 230. The one or more gate spacers may include dielectric materials that allow selective removal of the one or more dummy gate stacks 230. Suitable dielectric materials for the one or more gate spacers may include silicon nitride, silicon oxycarbonitride, silicon carbonitride, silicon oxide, silicon oxycarbide, silicon carbide, silico oxynitride, and/or combinations thereof. In an example process, layers of the one or more gate spacers are first conformally deposited using CVD, subatmospheric CVD (SACVD), or ALD over the workpiece 200, including the one or more dummy gate stacks 230. An etch back process is then etched back to remove these layers from top-facing surfaces, leaving behind the one or more gate spacers along sidewalls of the one or more dummy gate stacks 230.

Figure 10:
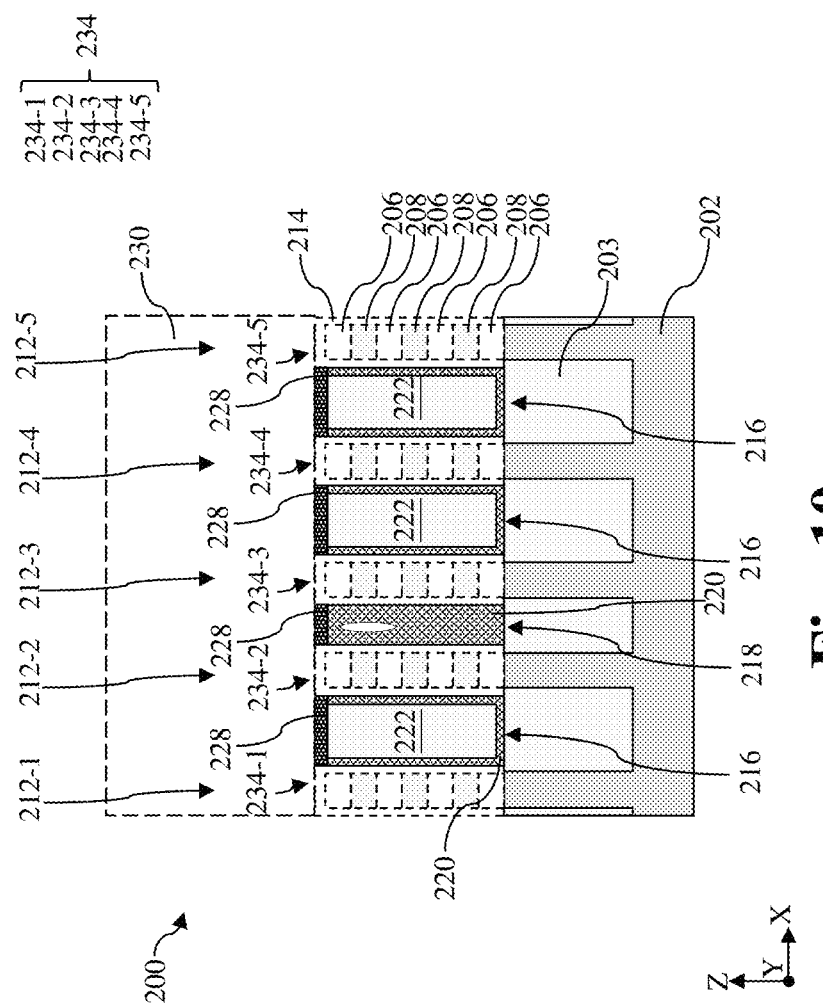

Referring to FIGS. 1 and 10, method 100 includes a block 120 where the source/drain regions of the first fin-shaped structure 212-1, the second fin-shaped structure 212-2, the third fin-shaped structure 212-3, the fourth fin-shaped structure 212-4, and the fifth fin-shaped structure 212-5 are recessed. With the one or more dummy gate stacks 230 and the one or more gate spacers masking the channel regions, source/drain regions of the fin-shaped structures 212 are recessed to form a first source/drain trench 234-1, a second source/drain trench 234-2, a third source/drain trench 234-3, a fourth source/drain trench 234-4, and a fifth source/drain trench 234-5. The first source/drain trench 234-1 is disposed in the source/drain region of the first fin-shaped structure 212-1. The second source/drain trench 234-2 is disposed in the source/drain region of the second fin-shaped structure 212-2. The third source/drain trench 234-3 is disposed in the source/drain region of the third fin-shaped structure 212-3. The fourth source/drain trench 234-4 is disposed in the source/drain region of the fourth fin-shaped structure 212-4. The fifth source/drain trench 234-5 is disposed in the source/drain region of the fifth fin-shaped structure 212-5. For ease of reference, the first source/drain trench 234-1, the second source/drain trench 234-2, the third source/drain trench 234-3, the fourth source/drain trench 234-4, and the fifth source/drain trench 234-5 may be collectively referred to as source/drain trenches 234. In some embodiments as illustrated in FIG. 10, operations at block 120 may substantially remove the stack portions 12S of fin-shaped structures 212. The recess at block 120 may include a dry etch process or a suitable etch process. For example, the dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As shown in FIG. 10, sidewalls of the sacrificial layers 206 and the channel layers 208 in the channel regions are exposed in the source/drain trenches 234. Because the channel regions are outside of cross-sectional plane in FIG. 10, the sacrificial layers 206 and the channel layers 208 are illustrated in dotted lines.

Figure 11:
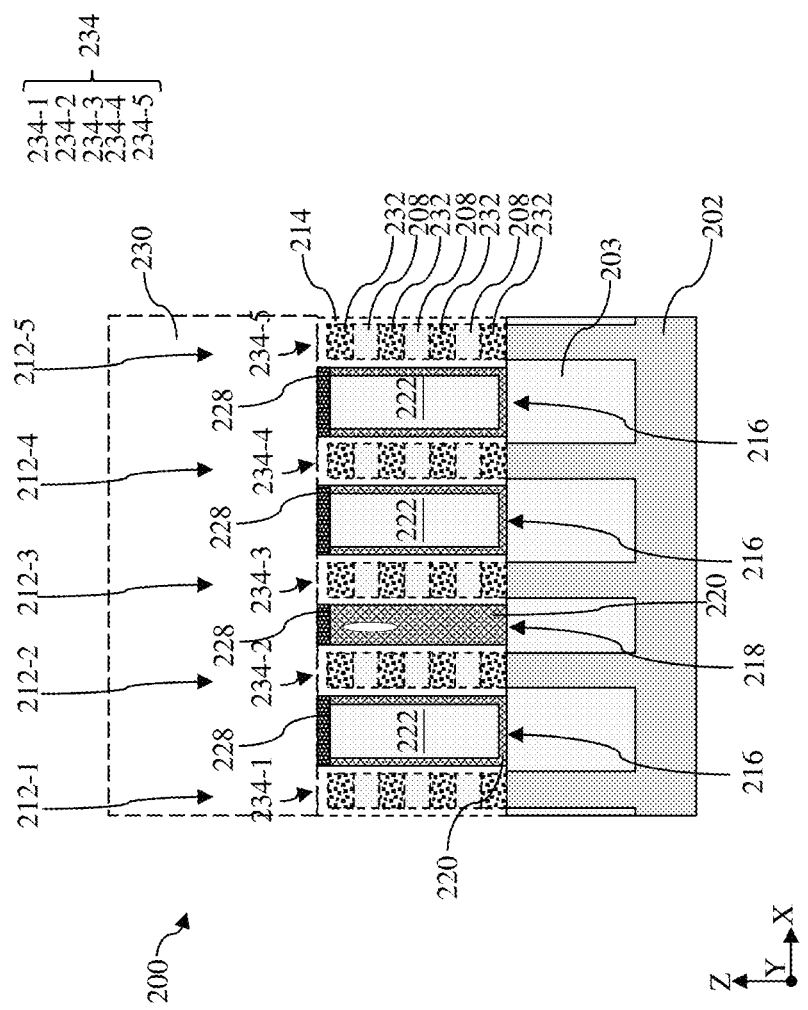

Referring to FIGS. 1 and 11, method 100 includes a block 122 where inner spacer features 232 are formed. At block 122, the sacrificial layers 206 exposed in the source/drain trenches 234 are selectively and partially recessed to form inner spacer recesses, while the exposed channel layers 208 are substantially unetched. In an embodiment where the channel layers 208 consist essentially of silicon (S1) and sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone. In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include a hydro fluoride (HF) or $NH_4OH$ etchant. An inner spacer material layer is then conformally deposited using CVD or ALD over the workpiece 200, including over and into the inner spacer recesses. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 232.

Figure 12:
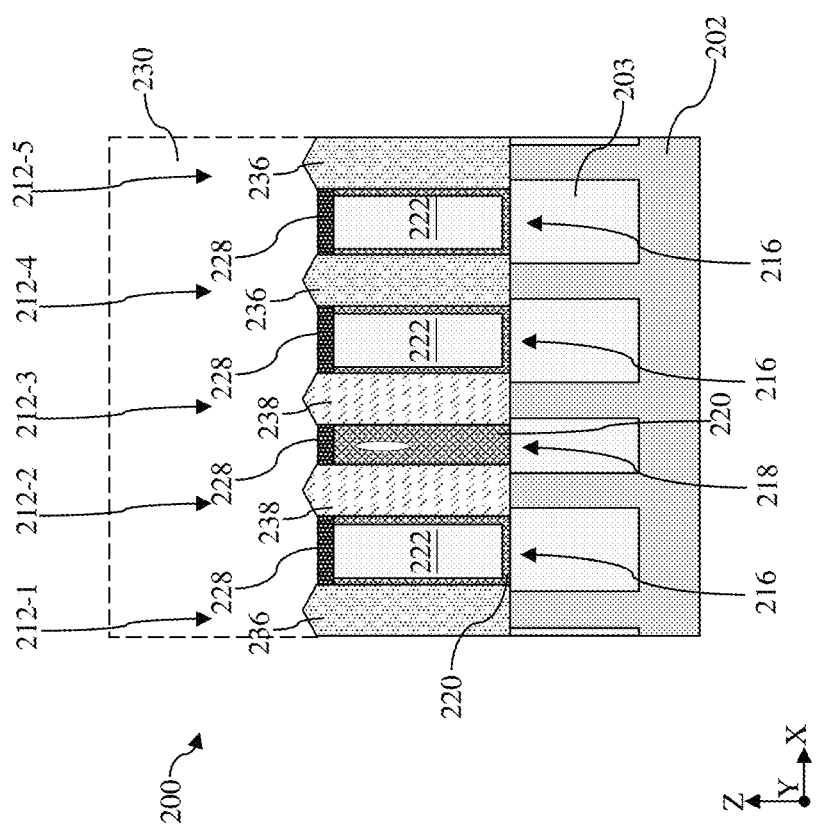

Referring to FIGS. 1 and 12, method 100 includes a block 124 where first-type source/drain features 236 and second-type source/drain features 238 are formed in the source/drain trenches 234. In some embodiments, the first-type source/drain features 236 are n-type source/drain features and the second-type source/drain features 238 are p-type source/drain features. In some alternative embodiments, the first-type source/drain features 236 are p-type source/drain features and the second-type source/drain features 238 are n-type source/drain features. Because the first-type source/drain features 236 are different from the second-type source/ drain features 238, they may be formed separately using at least a masking layer. In some embodiments, the first-type source/drain features 236 and the second-type source/drain features 238 may be formed using an epitaxial process, such as vapor-phase epitaxy (VPE), ultra-high vacuum CVD (UHV-CVD), molecular beam epitaxy (MBE), and/or other suitable processes. The epitaxial growth process may utilize gaseous and/or liquid precursors, which interact with the composition of the substrate 202 as well as the channel layers 208. Example n-type source/drain features may include silicon (Si), gallium arsenide (GaAs), arsenic-doped silicon (SiAs), phosphorus-doped silicon (SiP), phosphorus-doped gallium arsenide (GaAsP), or other suitable material. N-type source/drain features may be in-situ doped during the epitaxial process by introducing an n-type dopant, such as phosphorus (P), arsenic (As), or both, or by an implantation process (i.e., a junction implant process). Example p-type source/drain features may include geranium (Ge), silicon germanium (SiGe), aluminum-doped gallium arsenide (AlGaAs), boron-doped silicon germanium (SiGeB), or other suitable material. P-type source/drain features may be in-situ doped during the epitaxial process by introducing a p-type dopant, such as boron (B), or by an implantation process (i.e., a junction implant process).

Referring to FIG. 1, method 100 includes a block 126 where further processes are performed. Referring to FIGS. 1 and 14, method 100 may include further processes. Such further processes may include, for example, deposition of a contact etch stop layer (CESL), deposition of an interlayer dielectric (ILD) layer, removal of the dummy gate stacks 230 (shown in FIG. 12), selective removal of the sacrificial layers 206 in the channel regions, and formation of gate structures. In an example process, the CESL is first deposited over the workpiece 200. The CESL may include silicon nitride, silicon oxide, silicon oxynitride, and/or other materials known in the art. The CESL may be deposited using ALD, plasma-enhanced chemical vapor deposition (PECVD) process and/or other suitable deposition or oxidation processes. The ILD layer is deposited over the CESL. In some embodiments, the ILD layer includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer may be deposited by spin-on coating, a PECVD process or other suitable deposition technique. In some embodiments, after formation of the ILD layer, the workpiece 200 may be annealed to improve integrity of the ILD layer. To remove excess materials and to expose top surfaces of the dummy gate stacks 230, a planarization process, such a chemical mechanical polishing (CMP) process may be performed. The exposed dummy gate stacks 230 are then removed from the workpiece 200. The removal of the dummy gate stacks 230 results in gate trenches over the channel regions defined by the one or more gate spacers. The removal of the dummy gate stacks 230 may include one or more etching processes that are selective to the material in the dummy gate stacks 230. For example, the removal of the dummy gate stacks 230 may be performed using as a selective wet etch, a selective dry etch, or a combination thereof. After the removal of the dummy gate stacks 230, sidewalls of the cladding layer 214, channel layers 208 and sacrificial layers 206 in the channel regions are exposed in the gate trenches.

After the removal of the dummy gate stacks 230, the sacrificial layers 206 between the channel layers 208 and the cladding layer in the channel regions may be selectively removed to release the channel layers 208 to form channel members. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In embodiments where the sacrificial layers 206 and the cladding layer 214 are formed of silicon germanium, the selective removal includes silicon germanium oxidation followed by a silicon germanium oxide removal. For example, the oxidation may be provided by ozone clean and then silicon germanium oxide removed by an etchant such as $NH_4OH$. Gate structures are then deposited into the gate trenches to wrap around each of the channel members on the X-Z plane. In some embodiments, the gate structure includes a gate dielectric layer and a gate electrode formed over the gate dielectric layer. In some embodiments, the gate dielectric layer may include an interfacial layer and a high-k dielectric layer. High-K gate dielectrics, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be deposited using chemical oxidation, thermal oxidation, atomic layer deposition (ALD), chemical vapor deposition (CVD), and/or other suitable method. The high-K dielectric layer may include a high-K dielectric layer such as hafnium oxide. Alternatively, the high-K dielectric layer may include other high-K dielectrics, such as hafnium oxide (HfO), titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The high-K dielectric layer may be formed by ALD, physical vapor deposition (PVD), CVD, oxidation, and/or other suitable methods.

The gate electrode of the gate structure may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode may titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode of the gate structure may be formed by ALD, PVD, CVD, e-beam evaporation, or other suitable process. In various embodiments, a planarization process, such as a CMP process, may be performed to remove excessive materials to provide a substantially planar top surface of the gate structures.

Reference is made to FIG. 3. According to the present disclosure, the second spacing S2 is smaller than the first spacing S1 and the second smaller spacing S2 is a spacing for transistors of the same conductivity types. In FIG. 3, the smaller spacing S2 is X-direction spacing between the second fin-shaped structure 212-2 and the third fin-shaped structure 212-3. The second fin-shaped structure 212-2 and the third fin-shaped structure 212-3 are for transistors of one conductivity type and the first fin-shaped structure 212-1, the fourth fin-shaped structure 212-4 and the fifth fin-shaped structure 212-5 are for transistors of the other conductivity types. For example, the second fin-shaped structure 212-2 and the third fin-shaped structure 212-3 are for p-type MBC transistors and the first fin-shaped structure 212-1, the fourth fin-shaped structure 212-4 and the fifth fin-shaped structure 212-5 are for n-type MBC transistors. For another example, the second fin-shaped structure 212-2 and the third fin-shaped structure 212-3 are for n-type MBC transistors and the first fin-shaped structure 212-1, the fourth fin-shaped structure 212-4 and the fifth fin-shaped structure 212-5 are for p-type MBC transistors. There are reasons for this arrangement. For instance, source/drain features for different types of MBC transistors may be formed separately and merging of different source/drain features may be unlikely.

Figure 13:
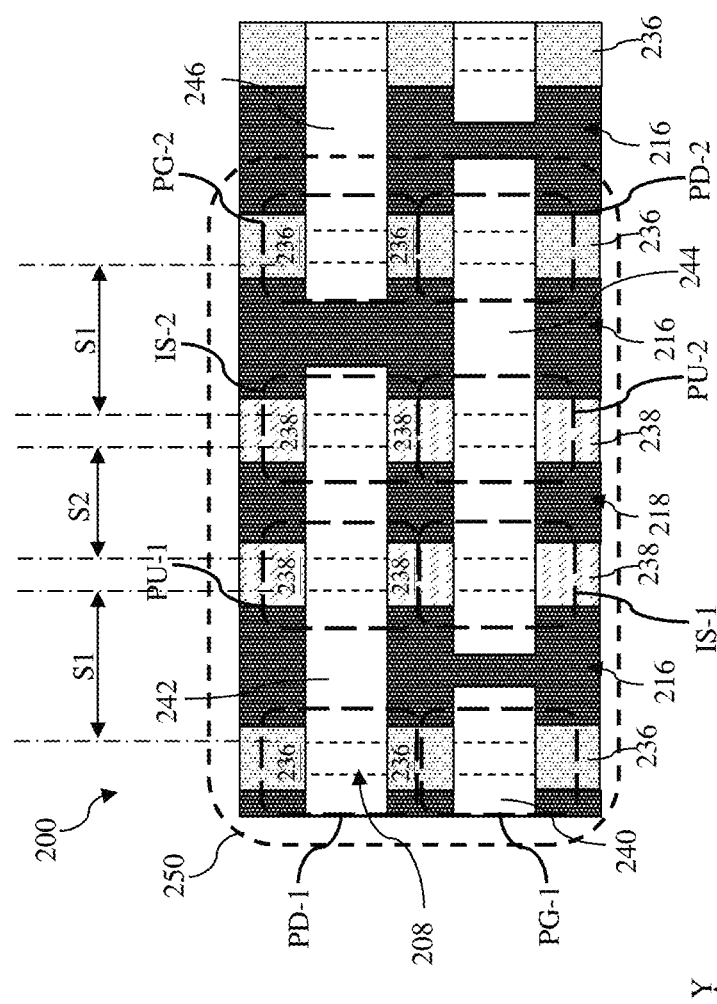
FIG. 13 illustrates a fragmentary top view of an example semiconductor device fabricated according to the method of FIG. 1, according to one or more aspects of the present disclosure.

The smaller second spacing S2 provides benefits. In a standard cell with a plurality of n-type MBC transistors and a plurality of p-type MBC transistors, reducing the spacing of neighboring n-type MBC transistors or neighboring p-type MBC transistors may reduce the X-direction dimension of the standard cell for greater packing density. When the X-direction dimension of a standard cell remains fixed, the smaller second spacing S2 between one type of devices may allow wider channel members for the other type of devices. The benefits of the present disclosure may be demonstrated in FIG. 13, which illustrates a top view of the semiconductor device 200. As shown in FIG. 13, the semiconductor device 200 includes a static random access memory (SRAM) cell 250. The SRAM cell 250 includes a first pull-down transistor (PD-1), a second pull-down transistor (PD-2), a first pull-up transistor (PU-1), a second pull-up transistor (PU-2), a first pass-gate transistor (PG-1), and a second pass-gate transistor (PG-2). In the implementations shown in FIG. 13, the SRAM cell 250 may further include a first isolation transistor (IS-1) and a second isolation transistor (IS-2). The first pass-gate transistor (PG-1) is controlled by the first gate structure 240. The first pull-down transistor (PD-1), the first pull-up transistor (PU-1), and the second isolation transistor (IS-2) may share a second gate structure 242. The first isolation transistor (IS-1), the second pull-up transistor (PU-2) and the second pull-down transistor (PD-2) may share a third gate structure 244. The second pass-gate transistor (PG-2) is controlled by a fourth gate structure 246.

In some embodiments, the first pull-down transistor (PD-1), the first pass-gate transistor (PG-1), the second pass-gate transistor (PG-2), and the second pull-down transistor (PD-2) are n-type MBC transistors disposed over p-type wells while the first pull-up transistor (PU-1) and the second pull-up transistor (PU-2) are p-type devices disposed over n-type wells. The source/drain features of the first pull-down transistor (PD-1), the first pass-gate transistor (PG-1), the second pass-gate transistor (PG-2), and the second pull-down transistor (PD-2) are first-type source/drain features 236. The first pull-up transistor (PU-1) and the second pull-up transistor (PU-2) are second-type source/drain features 238. In these embodiments, the first-type source/drain features 236 are n-type source/drain features and the second-type source/drain features 238 are p-type source/drain features. The first-type source/drain features 236 are spaced apart from the second-type source/drain features 238 by the first dummy fins 216. Neighboring second-type source/drain features 238 are spaced apart from one another by the second dummy fins 218. Neighboring-type are spaced apart from one another by the first dummy fins 216. As illustrated in FIG. 13, the smaller second spacing S2 may allow dimensional reduction of the SRAM cell 250 or may allow channel width increase along the X direction for the n-type transistors (including the first pull-down transistor (PD-1), the first pass-gate transistor (PG-1), the second pass-gate transistor (PG-2), and the second pull-down transistor (PD-2)). In the latter case, increasing the channel widths of the n-type MBC transistors may improve performance of the n-type MBC transistors and reduce the minimum supply voltage (Vccmin) of the SRAM cell 250.

In one exemplary aspect, the present disclosure is directed to a semiconductor device. The semiconductor device includes a first source/drain feature, a second source/drain feature, a third source/drain feature, a first dummy fin disposed between the first source/drain feature and the second source/drain feature along a direction to isolate the first source/drain feature from the second source/drain feature, and a second dummy fin disposed between the second source/drain feature and the third source/drain feature along the direction to isolate the second source/drain feature from the third source/drain feature. The first dummy fin includes an outer dielectric layer, an inner dielectric layer over the outer dielectric layer, and a first capping layer disposed over the outer dielectric layer and the inner dielectric layer. The second dummy fin includes a bottom portion and a second capping layer disposed over the bottom portion.

In some embodiments, the first source/drain feature is an n-type source/drain feature and the second source/drain feature and the third source/drain feature are p-type source/drain features. In some implementations, the first source/drain feature includes silicon and an n-type dopant and the second source/drain feature and the third source/drain feature include silicon germanium and a p-type dopant. In some embodiments, the inner dielectric layer is spaced apart from the first source/drain feature and the second source/drain feature by the outer dielectric layer. In some instances, the outer dielectric layer includes silicon carbonitride or silicon oxycarbonitride, the inner dielectric layer includes silicon oxide, and the first capping layer includes hafnium oxide, zirconium oxide, titanium oxide, tantalum oxide, or aluminum oxide. In some embodiments, the bottom portion includes silicon carbonitride or silicon oxycarbonitride and the second capping layer includes hafnium oxide, zirconium oxide, titanium oxide, tantalum oxide, or aluminum oxide. In some embodiments, a top surface of the inner dielectric layer and a top surface of the bottom portion are substantially coplanar. In some instances, a width of the first dummy fin along the direction is greater than a width of the second dummy fin along the direction.

In another exemplary aspect, the present disclosure is directed to a static random access memory (SRAM) cell. The SRAM cell includes a pull-down transistor including a first source/drain feature, a pull-up transistor including a second source/drain feature, a first dummy fin separating the pull-down transistor and the pull-up transistor along a direction, and a second dummy fin adjacent the second source/drain feature. The pull-up transistor is disposed between the first dummy fin and the second dummy fin along the direction. The first dummy fin includes an outer dielectric layer, an inner dielectric layer over the outer dielectric layer, and a first capping layer disposed over the outer dielectric layer and the inner dielectric layer. The second dummy fin includes a bottom portion and a second capping layer disposed over the bottom portion.

In some embodiments, the pull-down transistor includes an n-type transistor and the pull-up transistor includes a p-type transistor. In some embodiments, the first source/drain feature includes silicon and an n-type dopant and the second source/drain feature includes silicon germanium and a p-type dopant. In some implementations, the inner dielectric layer is spaced apart from the first source/drain feature and the second source/drain feature by the outer dielectric layer. In some embodiments, the outer dielectric layer includes silicon carbonitride or silicon oxycarbonitride, the inner dielectric layer includes silicon oxide, and the first capping layer includes hafnium oxide, zirconium oxide, titanium oxide, tantalum oxide, or aluminum oxide. In some instances, the bottom portion includes silicon carbonitride or silicon oxycarbonitride and the second capping layer includes hafnium oxide, zirconium oxide, titanium oxide, tantalum oxide, or aluminum oxide. In some implementations, a width of the first dummy fin along the direction is greater than a width of the second dummy fin along the direction.

In yet another exemplary aspect, the present disclosure is directed to a method. The method includes receiving a workpiece that includes a first fin-shaped structure extending lengthwise along a first direction and having a first base portion and a first stack portion over the first base portion, a second fin-shaped structure extending lengthwise along the first direction and having a second base portion and a second stack portion over the second base portion, wherein the first fin-shaped structure is spaced apart from the second fin-shaped structure by a first spacing, and a third fin-shaped structure extending lengthwise along the first direction and having a third base portion and a third stack portion over the third base portion, wherein the second fin-shaped structure is spaced apart from the third fin-shaped structure by a second spacing smaller than the first spacing. The method further includes forming an isolation feature between the first base portion and the second base portion, and between the second base portion and the third base portion, conformally depositing a first dielectric layer over the first stack portion, the second stack portion, and the third stack portion, and the isolation feature, depositing a second dielectric layer over the first dielectric layer, planarizing the workpiece to form a first dummy fin between the first stack portion and the second stack portion and a second dummy fin between the second stack portion and the third stack portion, etching back the first dummy fin and the second dummy fin, selectively etching back the second dummy fin, after the selectively etching, depositing a third dielectric layer over the workpiece, recessing the first stack portion, the second stack portion, and the third stack portion, and forming a first source/drain feature over the first base portion, a second source/drain feature over the second base portion, and a third source/drain feature over the third base portion.

In some embodiments, each of the first stack portion, the second stack portion, and the third stack portion includes a plurality of channel layers interleaved by a plurality of sacrificial layer. The plurality of channel layers include silicon and the plurality of sacrificial layers include silicon germanium. In some embodiments, the method further includes, before the conformally depositing, depositing a silicon germanium cladding layer over the first stack portion, the second stack portion, and the third stack portion. In some embodiments, the first dielectric layer includes silicon carbonitride or silicon oxycarbonitride, the second dielectric layer includes silicon oxide, and the third dielectric layer includes hafnium oxide, zirconium oxide, titanium oxide, tantalum oxide, or aluminum oxide. In some instances, after the etching back of the first dummy fin and the second dummy fin, a top surface of the second dummy fin is further away from the isolation feature than a top surface of the first dummy fin.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first source/drain feature;
   a second source/drain feature; a third source/drain feature;
   a first dummy fin disposed between the first source/drain feature and the second source/drain feature along a direction to isolate the first source/drain feature from the second source/drain feature;
   a second dummy fin disposed between the second source/drain feature and the third source/drain feature along the direction to isolate the second source/drain feature from the third source/drain feature; and
   a third dummy fin disposed adjacent to the third source/drain feature such that the second dummy fin and the third dummy fin sandwich the third source/drain feature along the direction,
   wherein the first dummy fin comprises a first outer dielectric layer, a first inner dielectric layer over the first outer dielectric layer, and a first capping layer disposed directly on top surfaces of the first outer dielectric layer and the first inner dielectric layer,
   wherein the second dummy fin comprises a bottom portion and a second capping layer disposed directly on a top surface of the bottom portion,
   wherein the third dummy fin comprises a second outer dielectric layer, a second inner dielectric layer over the second outer dielectric layer, and a third capping layer disposed directly on top surfaces of the second outer dielectric layer and the second inner dielectric layer,
   wherein the bottom portion comprises a uniform dielectric material and a void completely and continuously surrounded by the uniform dielectric material, and
   wherein the first source/drain feature is of a first conductivity type, the second source/drain feature and the third source/drain feature are of a second conductivity type different from the first conductivity type.

2. The semiconductor device of claim 1,
   wherein the first source/drain feature is an n-type source/drain feature,
   wherein the second source/drain feature and the third source/drain feature are p-type source/drain features.

3. The semiconductor device of claim 1,
   wherein the first source/drain feature comprises silicon and an n-type dopant,
   wherein the second source/drain feature and the third source/drain feature comprise silicon germanium and a p-type dopant.

4. The semiconductor device of claim 1, wherein the first inner dielectric layer is spaced apart from the first source/drain feature and the second source/drain feature by the first outer dielectric layer, and the semiconductor device further comprises a fourth source/drain feature adjacent to the third dummy fin, such that the third source/drain feature and the fourth source/drain feature sandwich the third dummy fin along the direction and are isolated by the third dummy fin, wherein the fourth source/drain feature is of the first conductivity type.

5. The semiconductor device of claim 1,
wherein the first outer dielectric layer and the second outer dielectric layer comprise silicon carbonitride or silicon oxycarbonitride,
wherein the first inner dielectric layer and the second inner dielectric layer comprise silicon oxide,
wherein the first capping layer and the third capping layer comprise hafnium oxide, zirconium oxide, titanium oxide, tantalum oxide, or aluminum oxide.

6. The semiconductor device of claim 1,
wherein the bottom portion comprises silicon carbonitride or silicon oxycarbonitride,
wherein the second capping layer comprises hafnium oxide, zirconium oxide, titanium oxide, tantalum oxide, or aluminum oxide.

7. The semiconductor device of claim 1, wherein a top surface of the first inner dielectric layer and a top surface of the bottom portion are substantially coplanar.

8. The semiconductor device of claim 1, wherein a width of the first dummy fin along the direction is greater than a width of the second dummy fin along the direction.

9. A static random access memory (SRAM) cell, comprising:
a pull-down transistor comprising a first source/drain feature;
a pull-up transistor comprising a second source/drain feature;
an isolation transistor comprising a third source/drain feature;
a first dummy fin separating the pull-down transistor and the pull-up transistor along a direction; and
a second dummy fin separating the second source/drain feature and the third source/drain feature,
wherein the pull-up transistor is disposed between the first dummy fin and the second dummy fin along the direction,
wherein the second source/drain feature is in physical contact with the first dummy fin and the second dummy fin,
wherein the first dummy fin comprises an outer dielectric layer, an inner dielectric layer over the outer dielectric layer, and a first capping layer disposed directly on top surfaces of the outer dielectric layer and the inner dielectric layer,
wherein the second dummy fin comprises a bottom portion and a second capping layer disposed directly on a top surface of the bottom portion.

10. The SRAM cell of claim 9,
wherein the pull-down transistor comprises an n-type transistor,
wherein the pull-up transistor comprises a p-type transistor,
wherein the pull-down transistor, the pull-up transistor, and the isolation transistor share a single gate structure.

11. The SRAM cell of claim 9,
wherein the first source/drain feature comprises silicon and an n-type dopant,
wherein the second source/drain feature comprises silicon germanium and a p-type dopant.

12. The SRAM cell of claim 9, further comprising a first isolation feature directly below the first dummy fin and a second isolation feature directly below the second dummy fin,
wherein a bottom surface of the first dummy fin directly contacts a topmost surface of the first isolation feature, a bottom surface of the second dummy fin directly contacts a topmost surface of the second isolation feature, and
wherein the inner dielectric layer is spaced apart from the first source/drain feature and the second source/drain feature by the outer dielectric layer.

13. The SRAM cell of claim 9,
wherein the outer dielectric layer comprises silicon carbonitride or silicon oxycarbonitride,
wherein the inner dielectric layer comprises silicon oxide,
wherein the first capping layer comprises hafnium oxide, zirconium oxide, titanium oxide, tantalum oxide, or aluminum oxide.

14. The SRAM cell of claim 9,
wherein the bottom portion comprises a dielectric material and a void completely surrounded by the dielectric material,
wherein the bottom portion comprises silicon carbonitride or silicon oxycarbonitride,
wherein the second capping layer comprises hafnium oxide, zirconium oxide, titanium oxide, tantalum oxide, or aluminum oxide.

15. The SRAM cell of claim 9, wherein a width of the first dummy fin along the direction is greater than a width of the second dummy fin along the direction.

16. A semiconductor structure, comprising:
a first source/drain feature;
a second source/drain feature;
a third source/drain feature;
a first dummy fin disposed between the first source/drain feature and the second source/drain feature along a direction;
a second dummy fin disposed between the second source/drain feature and the third source/drain feature along the direction; and
a third dummy fin disposed adjacent to the third source/drain feature along the direction, such that the third source/drain feature is between the second dummy fin and the third dummy fin,
wherein the first source/drain feature comprises silicon and an n-type dopant,
wherein the second source/drain feature and the third source/drain feature comprise silicon germanium and a p-type dopant,
wherein both a first width of the first dummy fin along the direction and a third width of the third dummy fin along the direction are greater than a second width of the second dummy fin along the direction,
wherein a top surface of the first dummy fin, a top surface of the third dummy fin, and a top surface of the second dummy fin are coplanar,
wherein the first dummy fin comprises a first dielectric layer as a first outer dielectric layer and a second dielectric layer as a first inner dielectric layer,
wherein the second dummy fin comprises the first dielectric layer as a bottom portion and is free of the second dielectric layer, wherein the third dummy fin comprises the first dielectric layer as a second outer dielectric layer and the second dielectric layer as a second inner dielectric layer, and wherein the first dielectric layer is more etch resistant than the second dielectric layer.

17. The semiconductor structure of claim 16, further comprising:
   a vertical stack of bridge-like channel members in contact with the first source/drain features; and
   a plurality of inner spacer features interleaving the vertical stack of bridge-like channel members.

18. The semiconductor structure of claim 16,
   wherein the first dummy fin further comprises a first capping layer disposed directly on top surfaces of the first outer dielectric layer and the first inner dielectric layer,
   wherein the second dummy fin further comprises a second capping layer disposed directly on a top surface of the bottom portion, and
   wherein the third dummy fin further comprises a third capping layer disposed directly on top surfaces of the second outer dielectric layer and the second inner dielectric layer.

19. The semiconductor structure of claim 18,
   wherein the first outer dielectric layer and the second outer dielectric layer comprise silicon carbonitride or silicon oxycarbonitride,
   wherein the first inner dielectric layer and the second inner dielectric layer comprise silicon oxide,
   wherein the first capping layer and the third capping layer comprise hafnium oxide, zirconium oxide, titanium oxide, tantalum oxide, or aluminum oxide.

20. The semiconductor structure of claim 18,
   wherein the bottom portion comprises silicon carbonitride or silicon oxycarbonitride,
   wherein the second capping layer comprises hafnium oxide, zirconium oxide, titanium oxide, tantalum oxide, or aluminum oxide.

* * * * *